(12) United States Patent
Yamazaki (10) Patent No.: US 10,193,052 B2
(45) Date of Patent: Jan. 29, 2019

(54) DEVICE AND INSPECTION METHOD OF THE SAME

(71) Applicant: KABUSHIKI KAISHA TOSHIBA, Minato-ku, Tokyo (JP)

(72) Inventor: Hiroaki Yamazaki, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 293 days.

(21) Appl. No.: 15/067,131

(22) Filed: Mar. 10, 2016

(65) Prior Publication Data

US 2017/0074925 A1 Mar. 16, 2017

(30) Foreign Application Priority Data

Sep. 10, 2015 (JP) .................................. 2015-178229

(51) Int. Cl.
*H01L 41/09* (2006.01)
*H05B 3/00* (2006.01)
*H05B 1/02* (2006.01)

(52) U.S. Cl.
CPC .............. *H01L 41/09* (2013.01); *H05B 1/023* (2013.01); *H05B 3/0014* (2013.01)

(58) Field of Classification Search
CPC ..... H01L 41/09; H01L 41/081; H01L 41/083; H01L 2924/00; H01L 2924/15; H01L 2924/15151; H01L 2924/15153; H01L 2924/1616; H01L 2924/1617; H01L 2924/1619; H01L 2924/3512; H05B 1/023; H05B 3/0014; H05B 1/0233; B81C 1/00158; B81C 1/00166; B81C 1/00182; B81C 1/0019; B81C 1/00198; B81C 2203/0721; B81C 2203/0714; B81C 2203/0764; B81C 2203/0771; H01G 5/40; H01C 2224/13
See application file for complete search history.

(56) References Cited

U.S. PATENT DOCUMENTS

2011/0291167 A1* 12/2011 Shimooka ........... B81C 1/00246
257/296

* cited by examiner

*Primary Examiner* — Shawntina Fuqua
(74) *Attorney, Agent, or Firm* — Holtz, Holtz & Volek PC (57) ABSTRACT

According to one embodiment, a device is disclosed. The device includes a substrate, an element provided on the substrate, and a film on the substrate. The film and the substrate constitute a cavity in which the element is housed. The device further includes a member capable of generating heat or deforming.

18 Claims, 10 Drawing Sheets

DEVICE AND INSPECTION METHOD OF THE SAME

CROSS-REFERENCE TO RELATED APPLICATIONS

This application is based upon and claims the benefit of priority from Japanese Patent Application No. 2015-178229, filed Sep. 10, 2015, the entire contents of which are incorporated herein by reference.

FIELD

Embodiments described herein relate generally to a device comprising an element provided on a substrate and an inspection method of the device.

BACKGROUND

A microelectromechanical systems (HEMS) element comprises a substrate, a fixed electrode (lower electrode) provided on the substrate and a movable electrode (upper electrode) provided above the fixed electrode. The HEMS element further comprises a thin-film dome (diaphragm) provided on the substrate. The thin-film dome and the substrate form a cavity in which the fixed electrode and the movable electrode are housed. When a failure analysis of the MEMS element is performed, the thin-film dome is required to be separated from the substrate.

DETAILED DESCRIPTION in general, according to one embodiment, a device is disclosed. The device includes a substrate, an element provided on the substrate, and a film on the substrate. The film and the substrate constitute a cavity in which the element is housed. The device further includes a member capable of generating heat or deforming.

In general, according to another embodiment, an inspection method of a device is disclosed. The method includes preparing a device. The device includes a substrate, an element provided on the substrate, a film provided on the substrate, the film and the substrate constituting a cavity in which the element is housed, and a member capable of generating heat or deforming. The method further includes generating a crack in the film by causing the member to generate heat or to deform, separating the film from the substrate, and inspecting the element.

Embodiments will be described hereinafter with reference to the accompanying drawings. The drawings are schematic and conceptual, and the dimensions, the proportions, etc., of each of the drawings are not necessarily the same as those in reality. Moreover, in the drawings, the same numbers represent the same or corresponding portions, and overlapping explanations thereof will be made as necessary.

First Embodiment

Figure 1:
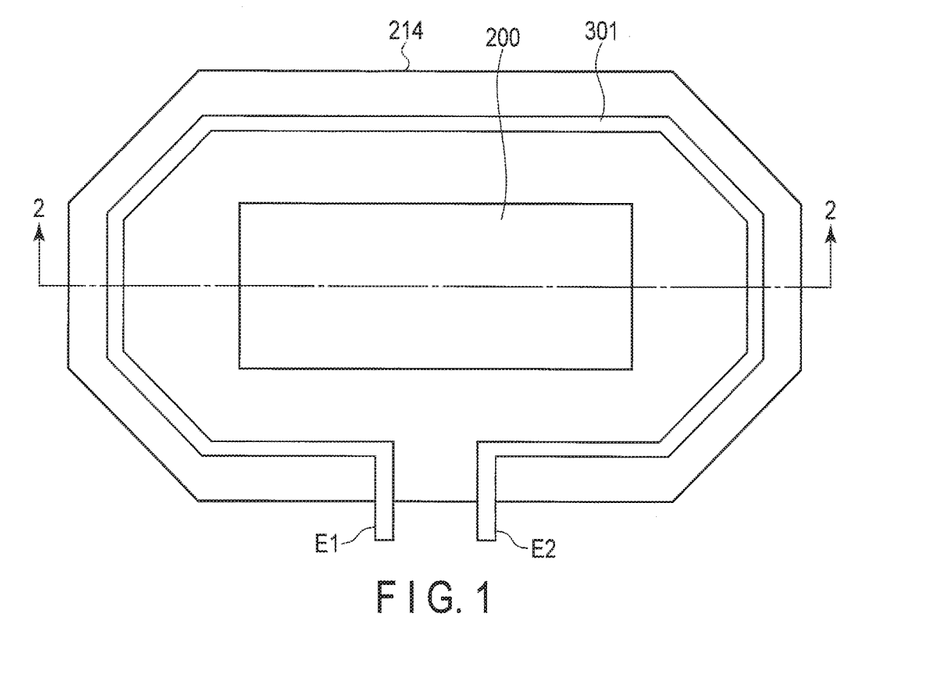
FIG. 1 is a plan view schematically illustrating a device according to a first embodiment.
Figure 2:
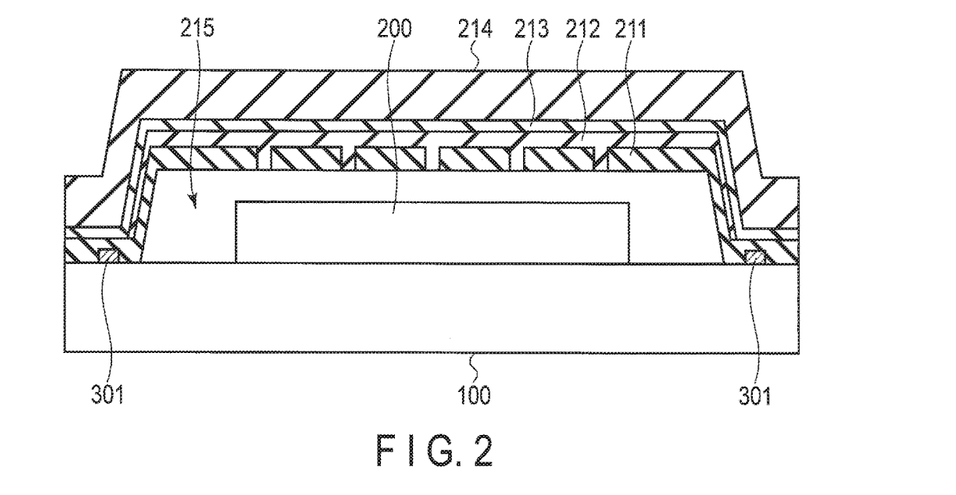
FIG. 2 is a cross-sectional view taken along line 2-2 of FIG. 1.

FIG. 1 is a plan view schematically illustrating a device according to the first embodiment. FIG. 2 is a cross-sectional view taken along line 2-2 of FIG. 1.

As shown in FIG. 2, the device of the present embodiment includes a substrate 100 and a MEMS element 200 provided thereon. The MEMS element 200 is used as, for example, a capacitor for a radio terminal.

Figure 3:
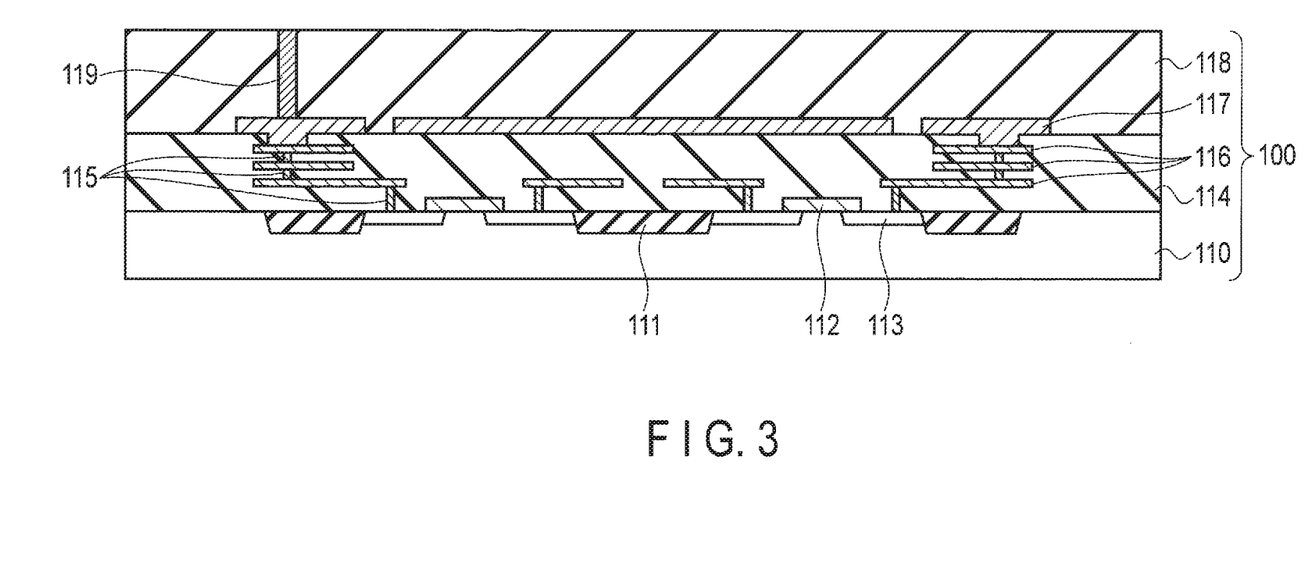
FIG. 3 is a cross-sectional view schematically illustrating an example of a configuration of a substrate in FIG. 2.

The substrate 100 includes, for example, a CMOS integrated circuit. FIG. 3 is a cross-sectional view schematically illustrating an example of a configuration of the substrate 100. The substrate 100 includes a silicon substrate 110. The CMOS integrated circuit is formed on the silicon, substrate 110.

The CMOS integrated circuit includes, for example, an isolation regions 111, a gate (gate electrode, gate insulating film) 112, a source/drain region 113, an interlayer insulating film 114, plugs 115, interconnects 116, an interconnects/plug 117, an interlayer insulating film 118, and a plug 119. The interlayer insulating film 118 is, for example, a silicon dioxide film formed by plasma-enhanced chemical vapor deposition (P-CVD) process and having a thickness of 20 µm.

Returning to FIG. 2, the MEMS element 200 includes a fixed electrode (lower electrode) (not shown) fixed on the substrate 100, and a movable electrode (upper electrode) provided above the fixed electrode and is vertically (non-horizontally) movable.

The device of the present embodiment further includes first to fourth cap films 211 to 214 provided on the substrate 100. The first to fourth cap films 211 to 214 constitute a thin-film dame (diaphragm). The substrate 100 and, the first to fourth cap films 211 to 214 constitute a cavity 215 in which the fixed electrode and the movable electrode are housed.

The device of the present embodiment further includes a crack generating pattern 301 provided on the substrate 100 outside the cavity 215. The crack generating pattern 301 is used to generate a crack in at least one of cap films 211 to 214 constituting the thin-film dome. When a failure analysis of the MEMS element is performed, the cap films 211 to 214 are required to be separated from the substrate 100. If a crack is generated in the thin-film dome, the cap films 211 to 214 can be separated from the substrate 100 with a small force. A material of the crack generating pattern 301 is, for example, a conductor such as aluminum (Al) or an aluminum-copper alloy (AlCu), or a semiconductor such as silicon (Si) or silicon-germanium (SiGe). The semiconductor may be polycrystalline. In addition, a state of the semiconductor may be amorphous.

As shown in FIG. 1, the crack generating pattern. 301 is formed around the MEMS element 200, but does not completely surround the MEMS element 200. That is, the crack generating pattern 301 has the shape of an open ring.

The crack generating pattern 301 comprises one end portion E1 and other end portion E2. The first end portion E1 and the second end portion E2 of the crack generating pattern 301 is connected to a current source (not shown). When a current supplied from the current source flows through the crack generator pattern 301, the crack generator pattern 301 generates heat.

Figure 4:
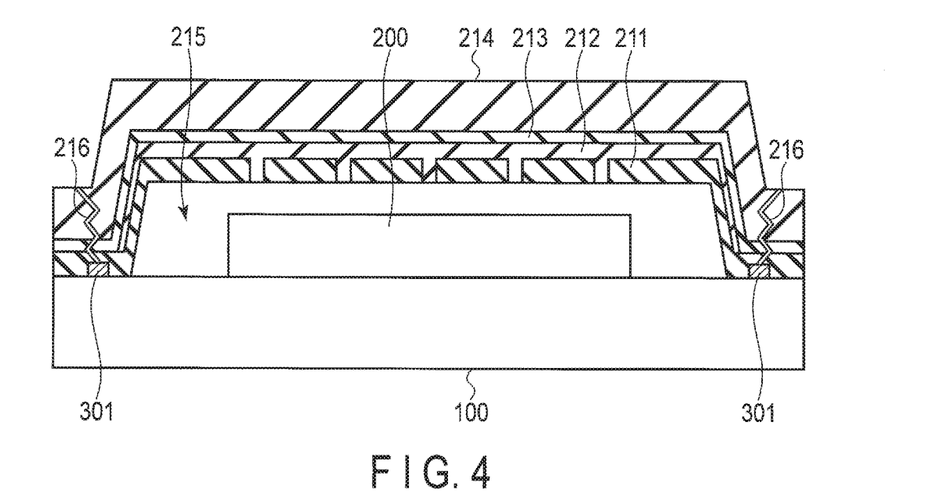
FIG. 4 is a cross-sectional view schematically illustrating the device of the embodiment comprising first to fourth cap films having a crack.

The first cap film 211 is expanded by the heat of the crack generating pattern 301, thereby generating a crack in the first cap film 211. Such a crack caused by thermal expansion may be also generated in the second to fourth cap films 212 to 214. FIG. 4 is a cross-sectional view schematically illustrating the device of the embodiment comprising the first to fourth cap films having cracks 216.

The first to fourth cap films 211 to 214 constituting the thin-film dome are enhanced in mechanical rigidity from the viewpoint of reliability. In order to improve the mechanical rigidity, for example, a silicon oxide film is used as the first cap film 211, and a silicon nitride film is used as the third can film 213. In addition, the fourth cap film 214, which is the outermost cap film, is the thickest among the cap films and has about 8 µm thickness, for example.

When the failure analysis of the MEMS element is performed, the cap films 211 to 214 are required to be separated from the substrate 100. In the present embodiment, the current is flowed through the crack generator pattern 301 to generate the cracks in the cap films 211-214 as described above, so that the separating of the cap films 211-214 is easily carried out. Thereafter, the failure analysis is performed to the HEMS element, which is exposed by separating the cap films 211-214 from the substrate 100.

The cap films 211 to 214 can also be separated from the substrate 100 by irradiating the cap films 211 to 214 with laser light. However, it requires a laser apparatus, and it also requires specifying conditions of the laser light for separating the cap films 211 to 214. Accordingly, the separating of the cap films 211-214 is not carried out easily.

Alternatively, the separating of the cap films 211-214 can also be carried out by cutting the can films 211-214 with an edged tool such as a surgical knife. However, the edged tool is manually handled, so that the component of the MEMS element 200 such as the upper electrode or the lower electrode may be damaged by the edged tool. Accordingly, it is not easy to carry out the separating of cap films 211 to 214 without causing unnecessary damage to the MEMS element 200. In the future where the miniaturization of the MEMS element 200 will have further advanced, it will be more difficult to perform the separating of the cap films 211 to 214 by manually handling the edged tool.

Figure 5:
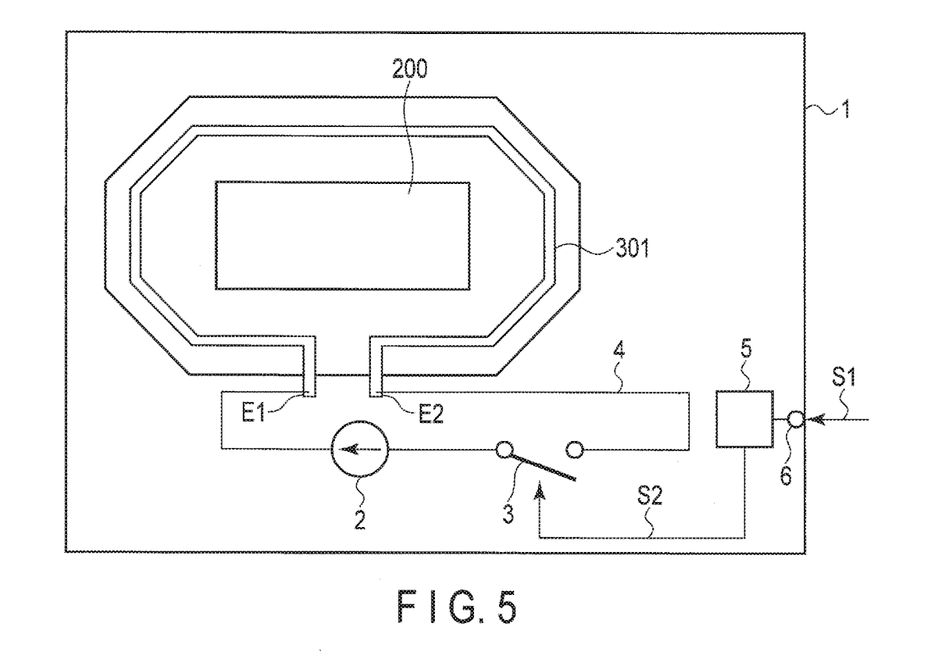
FIG. 5 is a diagram for explaining an example of a device comprising a mechanism for enabling a current to flow through a crack generating pattern.

FIG. 5 is a diagram for explaining an example of a device comprising a mechanism for enabling a current to flow through the crack generating pattern 300.

The device comprises a chip 1. The chip 1 includes the device shown in FIG. 2 (MEMS device), and further includes a current source 2, a switch 3, an interconnect 4, a control circuit 5 and an input terminal 6.

The one end portion E1 and the other end portion E2 of the crack generating pattern 301 are connected to the current source 2 via the interconnect 4. The switch 3 is provided in a middle of the interconnect 4. The state (open/off) of switch 3 is controlled by a control signal 32 from the control circuit 5. FIG. 5 shows the switch 3 in an off state. The control circuit 5 starts operating based on a signal S1 provided from outside the chip 1.

It should be noted that the current power source 2, the switch 3, the interconnect 4, the control circuit 5, and the input terminal 6 are provided in, for example, a lower layer than the MEMS element 200.

When the separating of the cap films is performed, signal S1 is first input to the control circuit 5 through the input terminal 6.

When signal S1 is input, the control circuit 5 generates a control signal 32 for closing the switch 3.

When the switch 3 is closed, a current from the current power source 2 is supplied to the crack generating pattern 301 through the interconnect 4, and the crack generating pattern 301 generates heat.

If it is determined that the cracks are generated in the cap films by the heat of the crack generator pattern 301, the control circuit 5 generates a signal for closing the switch 3. The above determination is performed based on, for example, a predetermined time. Specifically, it is examined in advance how long a current needs to flow through the crack generating pattern 301 to generate the cracks in the cap films. In general, the larger the current which flows through the crack generating pattern 300 is, the shorter the time during which the current needs to flow through the crack generating pattern 301 is.

The control circuit 5 monitors an elapsed time from when generating the control signal S2 for closing the switch 3, and when the predetermined time has elapsed, the control circuit 5 generates a control signal S2 for opening the switch 3.

Thereafter, the cap films are peeled from the substrate, and the failure analysis is performed to the MEMS element which is appeared by separating the cap films from the substrate.

Figure 6:
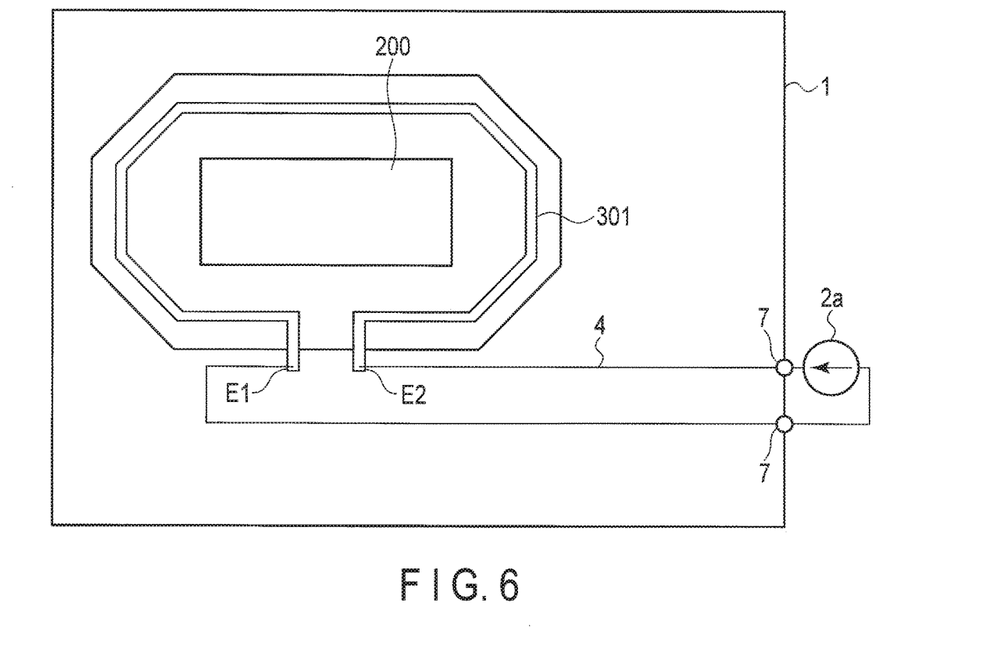
FIG. 6 is a diagram for explaining another example of a device comprising a mechanism for enabling a current to flow through a crack generating pattern.

FIG. 6 is a diagram for explaining another example of the device comprising the mechanism for enabling the current to flow through the crack generating pattern 301.

This device enables a current to flow through the crack generating pattern 301 by using an external current power source 2a. The external current power source 2a is provided outside the chip 1. The chip 1 comprises two pads (external pads) 7. By connecting the external current power source 2a to the external pads 7, a current from the external current power source 2a is supplied to the crack generating pattern 301 through the interconnect 4, and the crack generating pattern 301 300 generates heat.

It should be noted that the interconnect 4 and the pads 7 are provided in, for example, a higher layer than the MEMS element 200.

The device of the present embodiment will be further explained hereinafter according to its manufacturing method.

Figure 7:
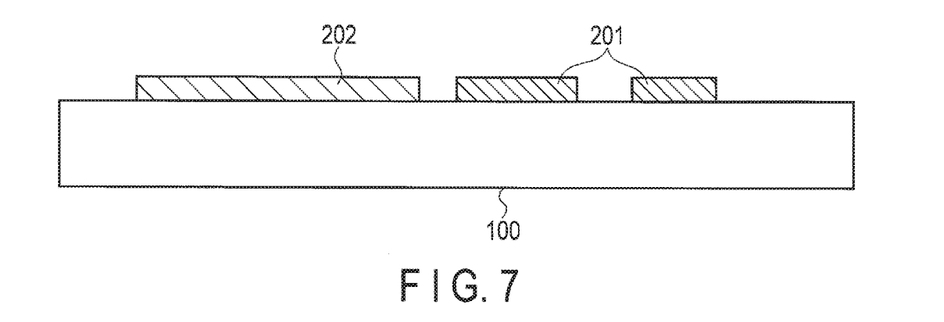
FIG. 7 is a cross-sectional view for explaining a method of manufacturing the device according to the first embodiment.

[FIG. 7]

A film (for example, conductive film or semiconductor film) to be processed into the fixed electrodes 201 and the interconnect 202 is formed on the substrate 100, thereafter, the above film is processed by lithography and etching, thereby forming the fixed electrode 201 and the interconnect 202. The above conductive film is, for example, an Al film or an AlCu film. The above semiconductor film is, for example, a Si film or a SiGe film.

Figure 8:
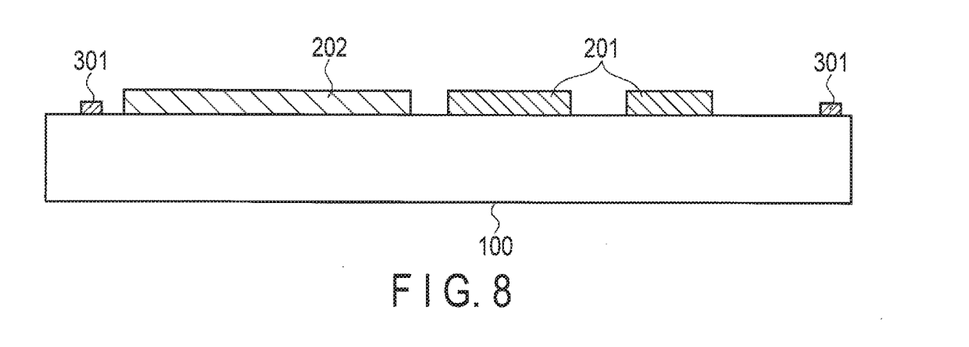
FIG. 8 is a cross-sectional view for explaining the method of manufacturing the device according to the first embodiment subsequent to FIG. 7.

[FIG. 8]

A film to be processed into the crack generating pattern 301 is formed on the substrate 100, thereafter, the above film is processed by photolithography and etching, thereby forming the crack generating pattern 301.

Generally, the thinner the crack generator pattern. 301 is, the higher the resistance of the crack generator pattern 301 is. The higher the resistance of the crack generator pattern 301 is, the higher the temperature of the crack generator pattern 301 when the current flows through the crack generator pattern 301. For that reason, in the present embodiment, the crack generator pattern 301 is thinner than the fixed electrode 201 and the interconnect 202. From the viewpoint of raising the temperature of the crack generator pattern 301, it is better that a material of the crack generator pattern 301 has higher resistance than materials of the fixed electrode 201 and the interconnect 202. In order to achieve this, the conductive film is not used, but the semiconductor film is used, for example.

In addition, when a material of film (first film) to be processed into the fixed electrode 201 and, the interconnect 202 and a material of film (second film) to be processed into the crack generator pattern 301 are same, the fixed electrode 201, the interconnect 202 and the crack generator pattern 301 can be formed at the same time in the step of FIG. 7. In this case, the fixed electrode 201, the interconnect. 202 and the crack generating pattern 301 are the same in thickness in a general process (one-time patterning). However, the crack generating pattern 301 can be thinner than the fixed electrode 201 and the interconnect 202 by patterning the first film twice (by lithography and etching).

Figure 9:
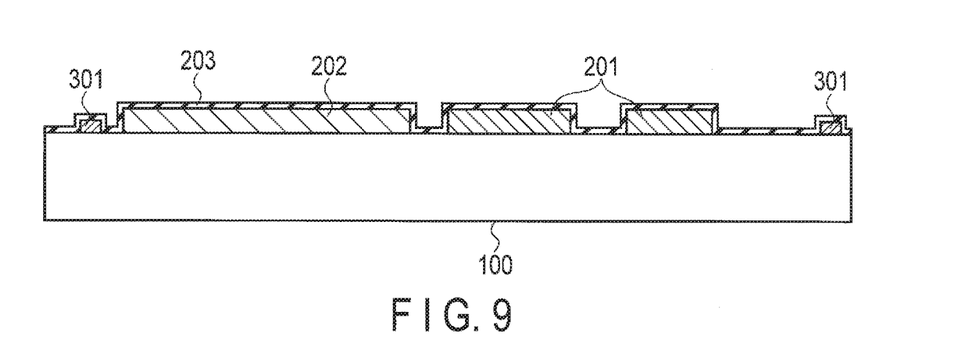
FIG. 9 is a cross-sectional view for explaining the method of manufacturing the device according to the first embodiment subsequent to FIG. 8.

[FIG. 9]

A passivation film 203 is formed on the entire surface by using, for example, P-CVD process, and the surfaces of the fixed electrodes 201, the interconnect 202 and the crack generating pattern 301 are covered with the passivation film 203.

Figure 10:
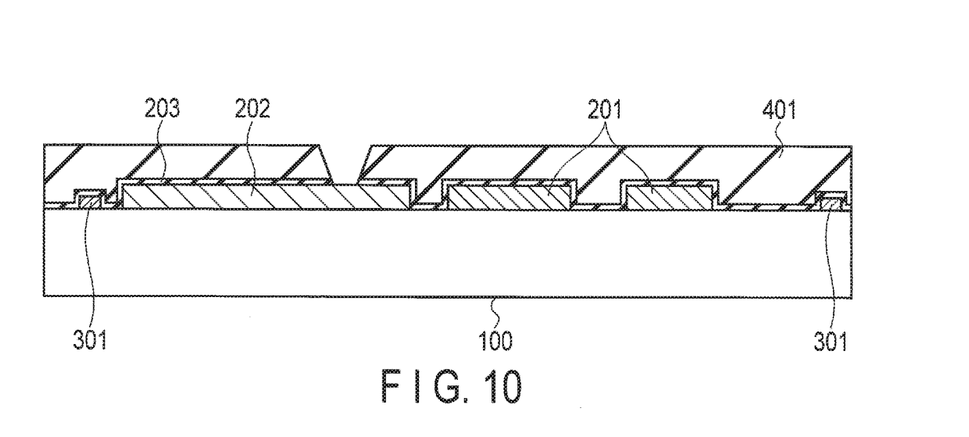
FIG. 10 is a cross-sectional view for explaining the method of manufacturing the device according to the first embodiment subsequent to FIG. 9.

[FIG. 10]

A first sacrifice film 401 is formed on the insulating film 105, thereafter, the first sacrifice film 401 and the passivation film 203 are processed by lithography and etching, thereby forming a through hole in the first sacrifice film 401 and the passivation film 203, which exposes a part of the top surface of the interconnect 202.

The above mentioned through hole is formed in a region corresponding to an anchor portion. The first sacrifice film 401 is, for example, an insulating film using an organic material such as polyimide or the like.

Figure 11:
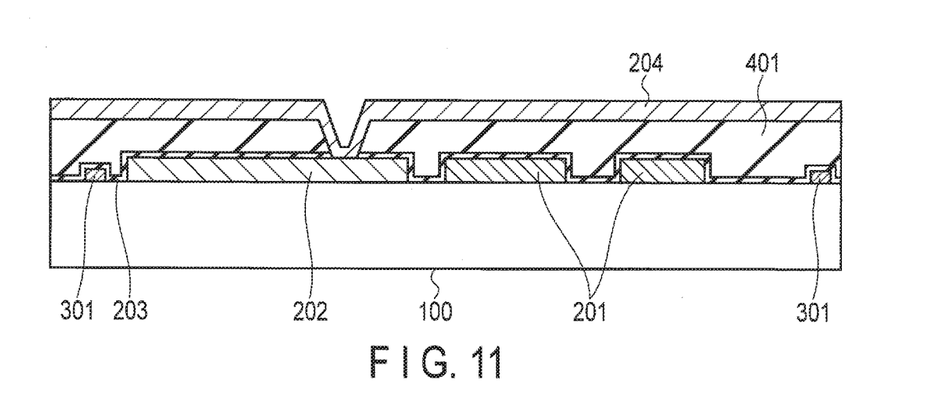
FIG. 11 is a cross-sectional view for explaining the method of manufacturing the device according to the first embodiment subsequent to FIG. 10.

[FIG. 11]

A conductive film 204 to be processed into the movable electrode and the anchor portion is formed on the first sacrificial film 401. The conductive film 204 is formed by, for example, a sputtering method. A material for the above conductive film is, for example, Al, an alloy using Al as its main component, Cu, Au, or Pt. A semiconductor film (for example, a Si film or a SiGe film) may be used instead of the conductive film 204.

Figure 12:
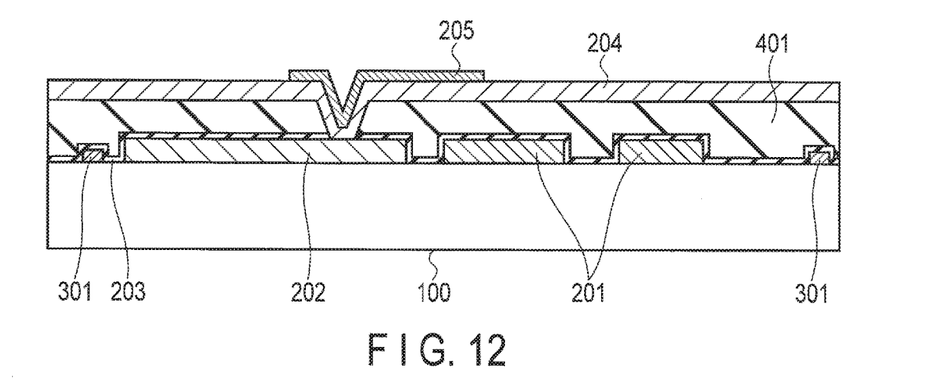
FIG. 12 is a cross-sectional view for explaining the method of manufacturing the device according to the first embodiment subsequent to FIG. 11.

[FIG. 12]

A conductive film to be processed into the spring portion 205 is formed on the conductive film 204, and then, the conductive film is processed by using photolithographic process and etching process, thereby forming the spring portion 205. In stead of the conductive film, a semiconductor film may be used. Material for the spring portion 205, and the materials for the movable electrode and the anchor portion may be the same or may be different. In addition, a semiconductor film may be used instead of a conductive film.

Figure 13:
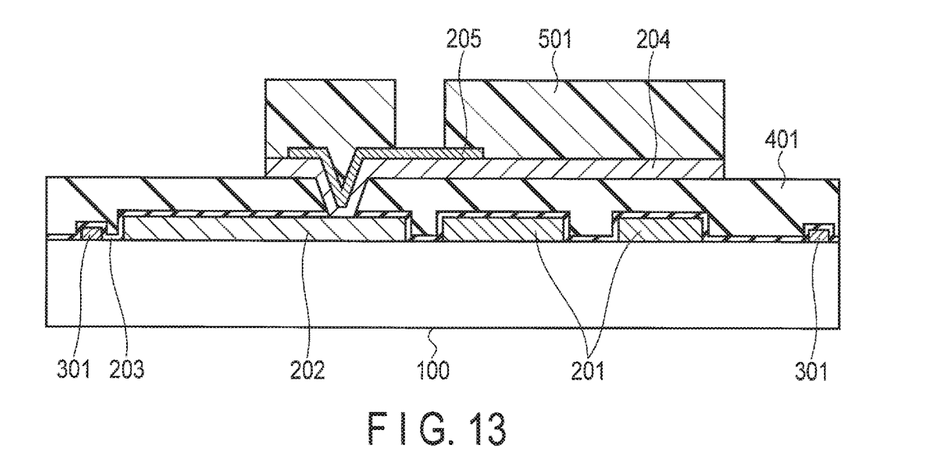
FIG. 13 is a cross-sectional view for explaining the method of manufacturing the device according to the first embodiment subsequent to FIG. 12.

[FIG. 13]

A resist pattern 501 is formed on the conductive film 204 and the spring portion 205. The resist pattern 501 has a pattern corresponding to the movable electrode and the anchor portion.

Figure 14:
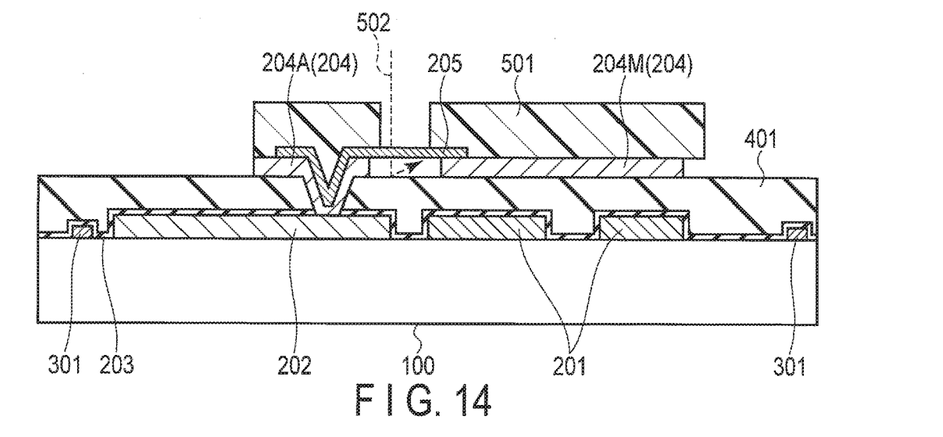
FIG. 14 is a cross-sectional view for explaining the method of manufacturing the device according to the first embodiment subsequent to FIG. 13.

[FIG. 14]

An anchor portion 204A and a movable electrode 204M are formed by patterning the conductive film 204 by wet etching using the resist pattern 501 as a mask.

The conductive film 204 located below the spring portion 205 not covered with the resist pattern 501 is etched from its side by etchant 502. Thus, the conductive film 204 is divided into the anchor portion 204A and the movable electrode 204M. The anchor portion 204A under the a left edge of resist pattern 501 is removed by the wet etching. Similarly, the movable electrode 204M under the a right edge of resist pattern 501 is removed by the wet etching.

It should be noted that the conductive film 204 may be patterned by isotropic etching other than wet etching.

After the anchor portion 204A and the movable electrode 204M are formed, the resist pattern 501 is removed.

Figure 15:
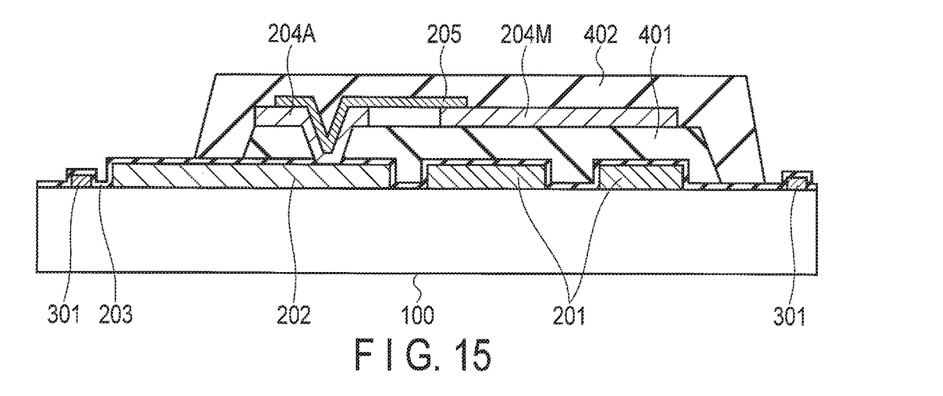
FIG. 15 is a cross-sectional view for explaining the method of manufacturing the device according to the first embodiment subsequent to FIG. 14.

[FIG. 15]

After the first sacrificial film 401 is patterned, an insulating film to be processed into a second sacrificial film 402 covering the anchor 204A, the movable electrode 204M and the spring 205 is formed, and then the above insulating film is patterned to form the second sacrificial film 402.

Figure 16:
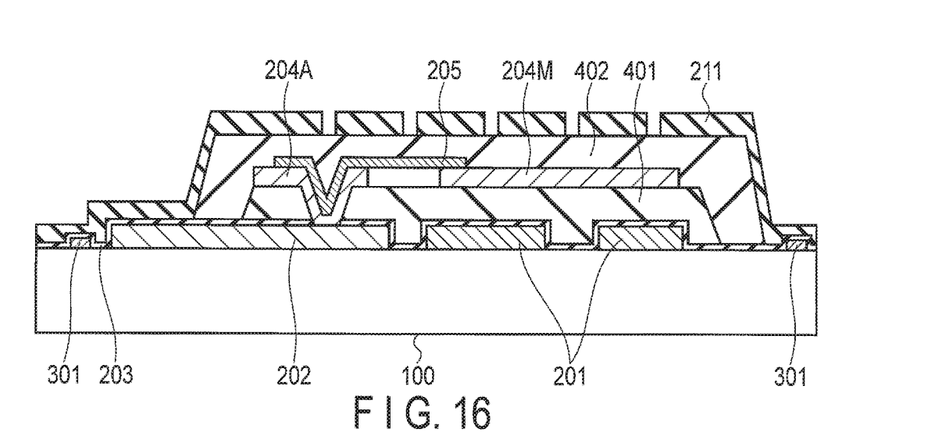
FIG. 16 is a cross-sectional view for explaining the method of manufacturing the device according to the first embodiment subsequent to FIG. 15.

[FIG. 16]

A first cap film 121 having a plurality of through holes is formed on the second sacrifice film 402 and the passivation film 203. The first cap film 211 is an inorganic film (for example, a silicon oxide film of a few hundreds nm-a few μm thickness). The first cap film 211 is formed by, for example, CVD process. The plurality of through holes are used to supply gas for removing the first and second sacrifice films 401 and 402 into the first cap film 221.

Figure 17:
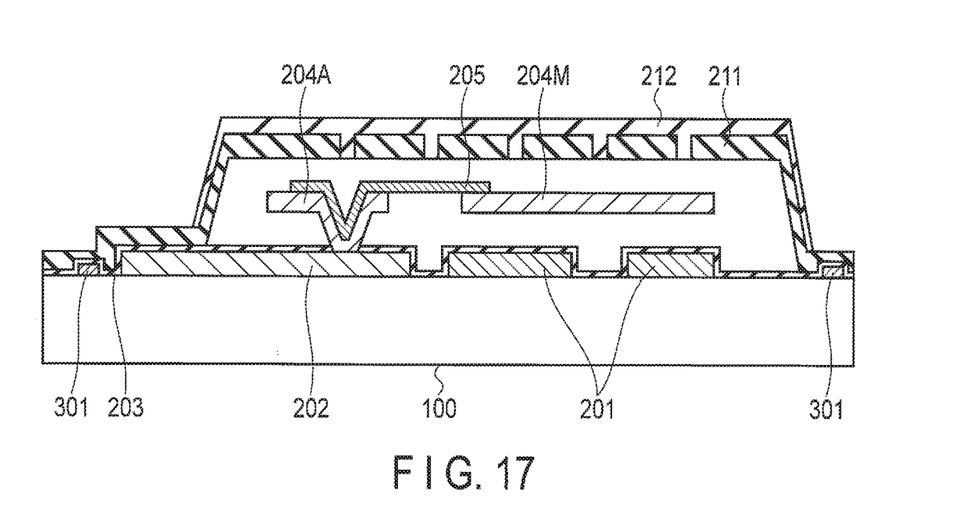
FIG. 17 is a cross-sectional view for explaining the method of manufacturing the device according to the first embodiment subsequent to FIG. 16.

[FIG. 17]

An insulating film to be processed into the second cap film 122 is formed on the first cap film 211 by coating method, and the above insulating film is processed by using, for example, lithography method and etching method, thereby forming the second cap film 212 which covers the upper and side surfaces of a portion of the first cap film 211 constituting the diaphragm.

In the present embodiment, the second cap film 212 is an organic film (insulating film) using an organic material such as polyimide or the like. In this case, the second cap film 212 can be formed to fill the plurality of through holes of the first cap film 211. The second cap film 212 needs not necessarily fill the plurality of through holes as long as the second cap film 212 closes the plurality of through holes.

Figure 18:
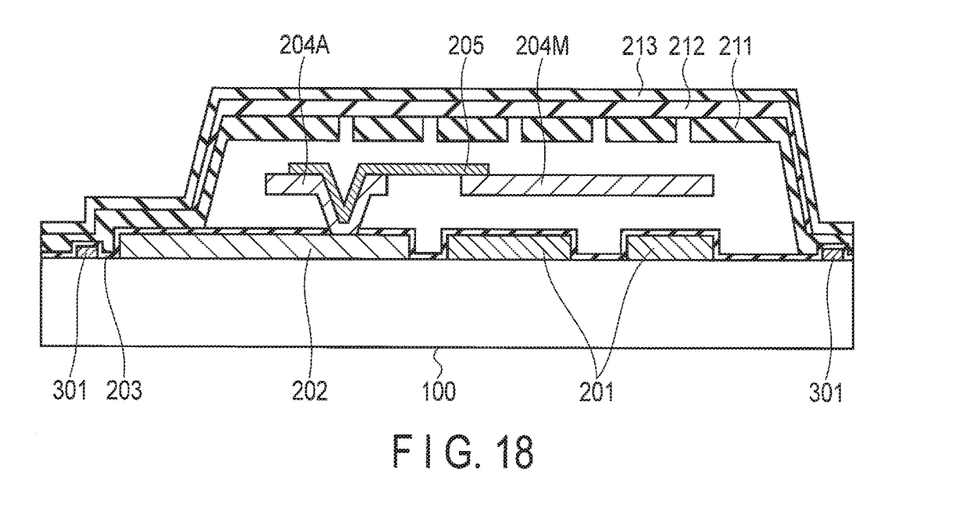
FIG. 18 is a cross-sectional view for explaining the method of manufacturing the device according to the first embodiment subsequent to FIG. 17.

[FIG. 18]

A third cap film 213 is formed on the first cap film 211 and the second cap film 212.

The third, cap film 213 serves as a moisture prevention film. Therefore, the third cap film 213 should preferably have lower moisture permeability than the second cap film 212. In other words, the third cap film 213 should preferably have lower hygroscopicity than the second cap film 212. In order to realize this, for example, the third cap film 213 should be an insulating film (for example, silicon nitride film) formed by CVD process, and the second cap film 212 should be a coating film formed by spin coating.

Figure 19:
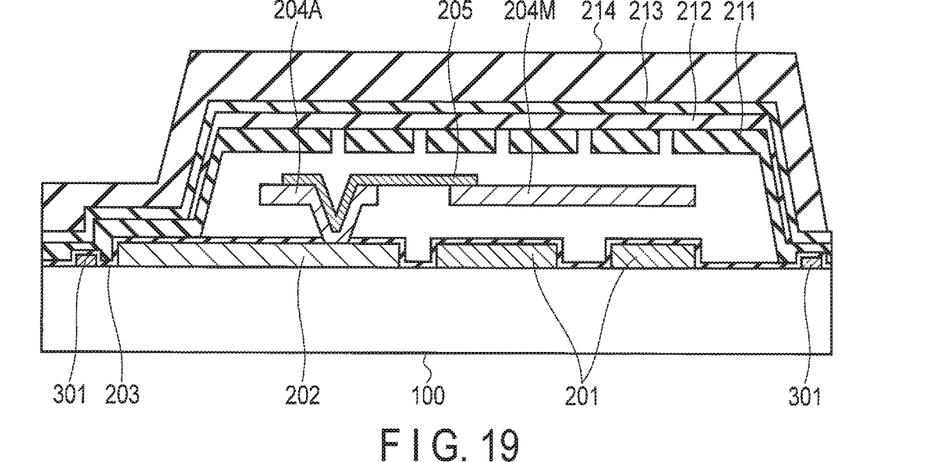
FIG. 19 is a cross-sectional view for explaining the method of manufacturing the device according to the first embodiment subsequent to FIG. 18.

[FIG. 19]

Thereafter, a fourth cap film (protective layer) 214 is formed on the third, cap film 213, thereby, obtaining the device including the crack generating pattern 301 and the MEMS element.

The fourth cap film 214 has a function to reinforce mechanical strength of the first to third cap films 211 to 213. The fourth cap film 214 is, for example, a resin film comprising an organic material such as polyimide or the like. The resin film is formed by, for example, coating method. The fourth cap film 214 is thicker than the first to third cap films 211 to 213.

Figure 20:
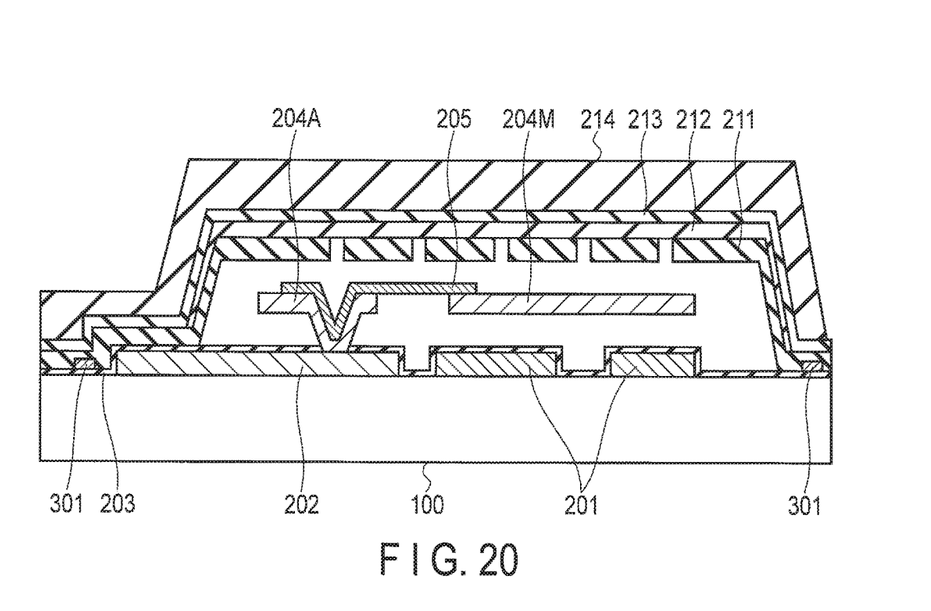
FIG. 20 is a cross-sectional view explaining a modified example of the device according to the first embodiment.

It should be noted that although in the present embodiment, the crack generator pattern 301 is formed on the substrate 110, but the crack generator pattern 301 may be formed on the passivation film, as shown in FIG. 20. In case of FIG. 20, the crack generator pattern 301 is contact with the cap film 211 not via the passivation film 203, so that the cap films 211 to 213 can be effectively heated by the crack generator pattern 301. This enables the cracks to be generated more easily in the cap films 211-213, and the separating of the cap films 211-213 can be carried out more easily.

It should be noted that although in the present embodiment, the crack generator pattern is provided to that device including the MEM element in which the cavity is formed by the thin film-dome and the substrate, but the crack generator pattern may be provided to a device including other type of MEMS element in which a cavity is formed by a substrate, a side wall portion and an upper wall portion.

Figure 21:
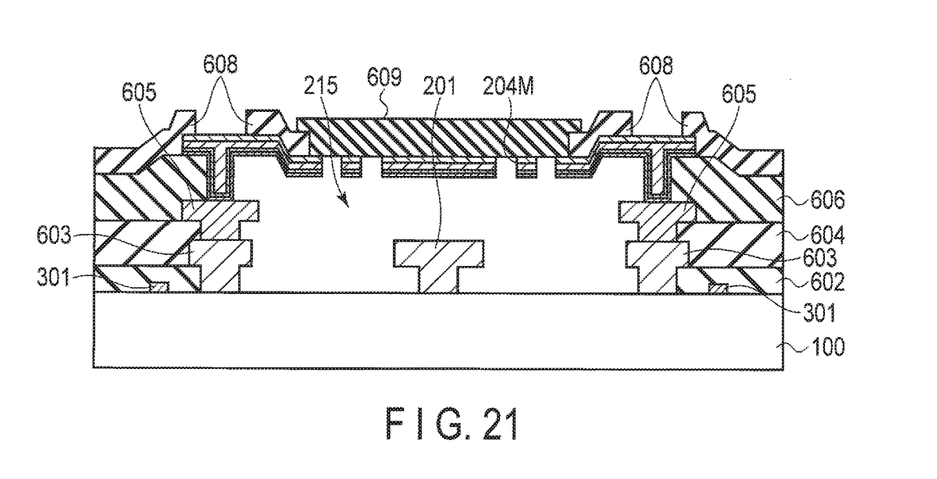
FIG. 21 is a cross-sectional view explaining another modified example of the device according to the first embodiment.

An example of the other type of MEMS element is shown in FIG. 21. Insulating films 602, 604 and 606 constitute the side wall portion, and an insulating film. 608 and a covering layer 609 constitute the upper wall portion. A movable electrode 204M has a plurality of through holes, and the plurality of through holes are covered with the covering layer 609. A material of the covering layer 609 is insulator or conductor. Reference numbers 603 and 605 represent interconnect layers. The crack generator pattern 301 generates heat which causes the cracks in at least one of the insulating films 602, 604, 606.

In the present embodiment, a crack is produced in at least one of cap films 211 to 214 constituting the thin-film dome by producing heat in the crack generating pattern 301. However, a crack may be produced by deforming the crack generating pattern 301 (i.e., increasing the volume of the crack generating pattern 301).

It is noted that the present embodiment explains a case where the cracks are generated in the at least one of the cap films 211 to 214 constituting the thin-film dome by causing the crack generator pattern 301 to generate the heat, but the cracks may be generate by causing the crack generator pattern. 301 to deform a shape thereof (enlarge a volume thereof).

More specifically, if lead zirconium titanate (PZT) or aluminum nitride (AlN) is used as a material of the crack generating pattern 301, the crack generating pattern 301 has a piezoelectric effect. Therefore, when voltage is applied to the crack generating pattern 301, the crack generating pattern 301 is deformed to, stress is applied to the at least one of can films 211 to 214, and the cracks are generated in the at least one of cap films 211 to 214. In order to apply the voltage to the crack generating pattern 301, for example, a mechanism obtained by changing the current source of FIG. 4 or FIG. 5 to a voltage source can be used.

Second Embodiment

Figure 22:
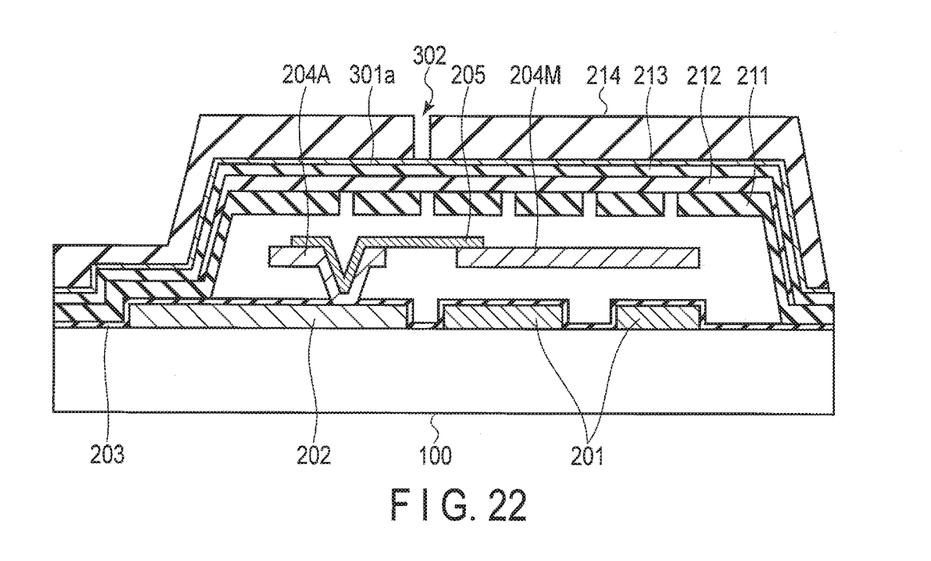
FIG. 22 is a cross-sectional view illustrating a device according to a second embodiment.

FIG. 22 is a cross-sectional view illustrating a device according to a second embodiment.

The present embodiment is different from the first embodiment in that a crack generating pattern 301a is provided in cap films 211 to 214. The crack generating pattern 301a contains a material that generates heat by absorbing hydrogen, more specifically, a hydrogen storage alloy. As the hydrogen storage alloy, for example, AB2-type (based on an alloy of a transition element such as titanium, manganese, zirconium or nickel), and AB5-type (based on an alloy containing a transition element (nickel, cobalt, aluminum or the like) having a catalyst effect on rare-earth element, niobium or zirconium (for example, $LaNi_5$, $ReNi_5$)) are known. Besides these, Ti—Fe system alloy, V system alloy, Mg alloy, Rd system alloy, and Ca system alloy are also known.

In FIG. 22, the crack generating pattern 301a is provided between the third cap film 213 and the fourth cap film 214. However, the crack generating pattern 301a may be provided between the second cap film 212 and the third cap film 213.

In addition, a through hole 302 reaching the crack generating pattern 301a is provided in the fourth cap film 214. The through-hole 302 is used as an inlet to supply hydrogen to the crack generating pattern 301a.

In FIG. 22, the single through hole 302 is presented, but a plurality of the through holes may be provided. In addition, when the crack generating pattern 301a is provided between the second cap film 212 and the third cap film 213, the through hole 302 reaching the crack generating pattern 301a is provided in the fourth cap film 214 and the third cap film.

When the cap films 211 to 214 are separated from the substrate 100, hydrogen is supplied to the crack generating pattern 301a from the through hole 302. The crack generating pattern 301a generates heat by absorbing hydrogen. Since the heat expands cap films 211 to 214 and thereby produces a crack in cap films 211 to 214, cap films 211 to 214 can be easily peeled. It is not necessary to generate the cracks in all of the four cap films 211 to 214, but when the cracks are generated in all of the cap films 211 to 214, the separating of the cap films 211-214 is generally carried out most easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device comprising:
a substrate;
an element provided on the substrate;
a film on the substrate, the film and the substrate constituting a cavity in which the element is housed; and
a member provided outside the cavity, and capable of generating heat,
wherein the member generates the heat when current flows through the member.

2. The device according to claim 1, further comprising a current source for supplying the current to the member.

3. The device according to claim 1, further comprising a pad to be connected to an external current source,
wherein the member is to be connected to the external current source via the pad.

4. The device according to claim 1, wherein the member contains aluminum, silicon germanium or silicon.

5. The device according to claim 1, wherein the member includes a pattern having a shape of an open ring.

6. The device according to claim 1, wherein the member is disposed between the substrate and the film.

7. A device comprising:
a substrate;
an element provided on the substrate;
a film on the substrate, the film and the substrate constituting a cavity in which the element is housed; and
a member provided outside the cavity, and capable of generating heat,
wherein the member contains a material which generates heat by absorbing hydrogen.

8. The device according to claim 7, wherein the material is a hydrogen storage alloy.

9. The device according to claim 7, wherein the member is provided in the film.

10. A device comprising:
a substrate;
an element provided on the substrate;
a film on the substrate, the film and the substrate constituting a cavity in which the element is housed; and
a member provided outside the cavity, and capable of generating heat or deforming,
wherein the element includes a first electrode fixed on the substrate, and a second electrode provided above the first electrode and being movable non-horizontally.

11. The device according to claim 10, wherein the member contains a material having a piezoelectric effect.

12. The device according to claim 11, wherein the material includes lead zirconium titanate or aluminum nitride.

13. The device according to claim 11, further comprising a voltage source to apply a voltage to the member.

14. The device according to claim 11, further comprising a pad to be connected to an external voltage source for applying a voltage to the member.

15. The device according to claim 10, wherein the film includes a first film having a plurality of through holes, a second film provided on the first film and facing the plurality of through holes, and a third film provided on the second film.

16. The device according to claim 15, wherein the third film has lower moisture permeability than the second film.

17. The device according to claim 15, wherein the film further includes a fourth film provided on the third film.

18. The device according to claim 17, wherein the fourth film is thicker than the first film, the second film and the third film.

* * * * *